(12) United States Patent
Lai

(10) Patent No.: US 8,987,766 B2
(45) Date of Patent: Mar. 24, 2015

(54) LED CHIP WITH GROOVE AND METHOD FOR MANUFACTURING THE SAME

(71) Applicant: Hon Hai Precision Industry Co., Ltd., New Taipei (TW)

(72) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 20 days.

(21) Appl. No.: 13/921,215

(22) Filed: Jun. 19, 2013

(65) Prior Publication Data

US 2014/0175497 A1      Jun. 26, 2014

(30) Foreign Application Priority Data

Dec. 21, 2012    (TW) .............................. 101149100 A

(51) Int. Cl.
| | |
|---|---|
| H01L 29/22 | (2006.01) |
| H01L 33/20 | (2010.01) |
| H01L 33/00 | (2010.01) |
| H01L 33/08 | (2010.01) |
| H01L 33/42 | (2010.01) |

(52) U.S. Cl.
CPC .............. *H01L 33/20* (2013.01); *H01L 33/005* (2013.01); *H01L 33/08* (2013.01); *H01L 33/42* (2013.01); *H01L 2933/0091* (2013.01)
USPC 257/98; 257/95; 257/E33.067; 257/E33.068; 257/E33.07

(58) Field of Classification Search
USPC ................ 257/94, 95, 98, E33.005, E33.067, 257/E33.068, E33.07
See application file for complete search history.

(56) References Cited

U.S. PATENT DOCUMENTS

2010/0084669 A1*    4/2010    Furukawa et al. .............. 257/94

\* cited by examiner

*Primary Examiner* — Matthew E Warren
(74) *Attorney, Agent, or Firm* — Novak Druce Connolly Bove + Quigg LLP

(57) ABSTRACT

An LED chip includes a substrate and an epitaxy structure formed on the substrate. The epitaxy structure includes a first semiconductor layer, a light emitting layer and a second semiconductor layer. A plurality of grooves are defined through the first semiconductor layer, the light emitting layer and the second semiconductor layer. The light emitting layer is exposed from the grooves. A transparent insulative layer is filled in the grooves. An electrode is further formed on the transparent insulative layer.

10 Claims, 6 Drawing Sheets

LED CHIP WITH GROOVE AND METHOD FOR MANUFACTURING THE SAME

BACKGROUND

1. Technical Field

The disclosure generally relates to an LED (light emitting diode) chip, and more particularly, to an LED chip with grooves to increase light intensity and restrict heat generation thereof.

2. Description of Related Art

Nowadays LEDs (light emitting diodes) are used widely in various applications for illumination. A typical LED chip generally includes a substrate, an N-type semiconductor layer formed on the substrate, a light emitting layer formed on the N-type semiconductor layer, a p-type semiconductor layer formed on the light emitting layer, and two electrodes formed on the P-type semiconductor layer and the N-type semiconductor layer, respectively. In operation, current flows from one electrode to the other electrode, thereby activating the light emitting layer to emit light.

In order to obtain larger light intensity, the chip is often made to have a large area. However, heat generated by the chip also increases accompanying the increasing of the area of the chip. The increased heat adversely affects the light emitting efficiency of the chip. As a result, the light intensity of the chip is decreased accordingly. Therefore, the heat generation and the light intensity of the typical chip cannot be well balanced.

What is needed, therefore, is an LED chip with grooves and a method for manufacturing the LED chip which can address the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the various views.

DETAILED DESCRIPTION

FIGS. 1-6 show a method of manufacturing an LED (light emitting diode) chip 90 in accordance with an embodiment of the present disclosure. The method mainly includes steps as discussed below.

Figure 1:
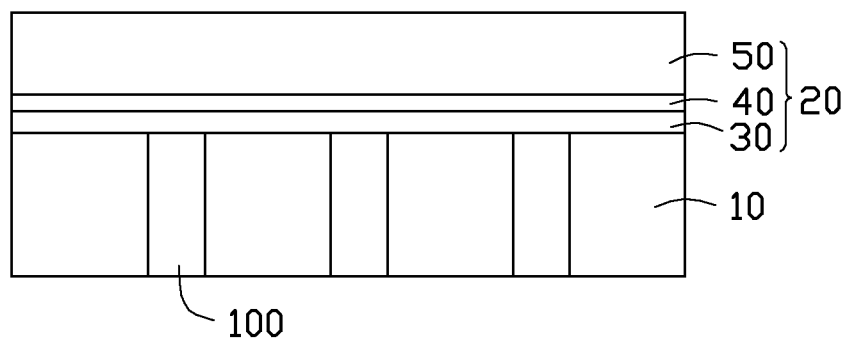
FIG. 1 shows a step of a method for manufacturing an LED chip in accordance with an embodiment of the present disclosure.
Figure 2:
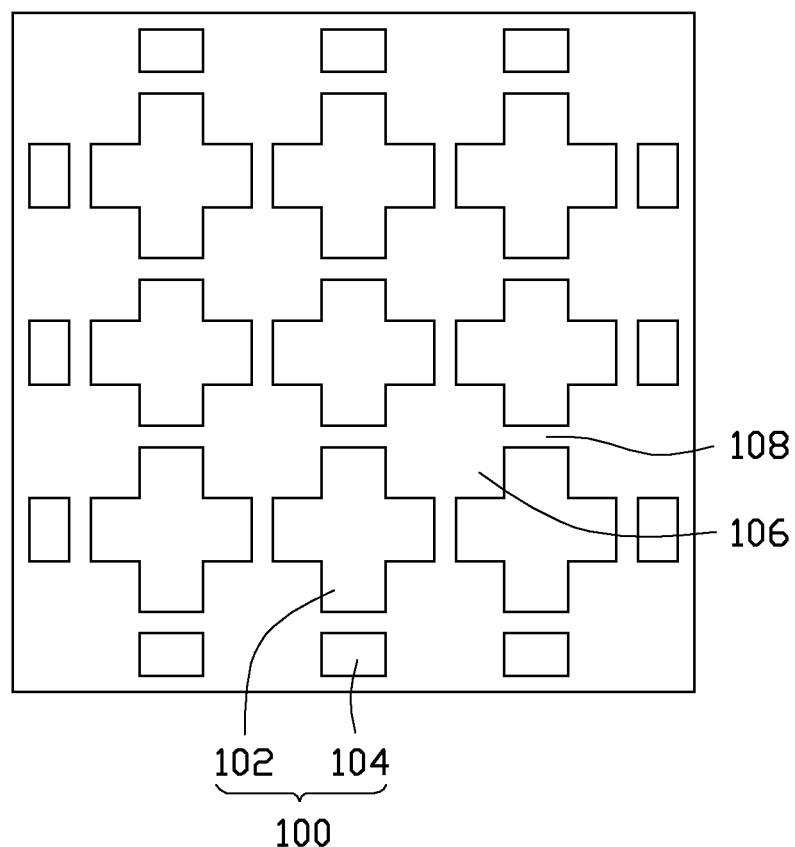
FIG. 2 shows the step of FIG. 1 from a bottom view.

Firstly, as shown in FIGS. 1-2, an epitaxy structure 20 joined with a substrate 10 is made. The epitaxy structure 20 includes a first semiconductor layer 30, a light emitting layer 40 and a second semiconductor layer 50. The first semiconductor layer 30 may be a P-type semiconductor layer made of GaN, InGaN, AlInGaN or other suitable materials. The second semiconductor layer 50 may be an N-type semiconductor layer made of GaN, InGaN, AlInGaN or other suitable materials. The light emitting layer 40 may be a multiple quantum wall layer made of GaN, InGaN, AlInGaN or other suitable materials. The substrate 10 may be made of metal such as Cu, Al, Ag or the like. The substrate 10 defines a plurality of slots 100 therein. In this embodiment, the slots 100 include a plurality of first slots 102 and a plurality of second slots 104 spaced from the first slots 102. The first slots 102 and the second slots 104 may be formed by etching predetermined portions of the substrate 10. Each of the first slots 102 and the second slots 104 extends from a top face to a bottom face of the substrate 10. Each first slot 102 has a cross shape in cross section, and each second slot 104 has a rectangular shape in cross section. The first slots 102 are located at a central area of the substrate 10, and the second slots 104 are located adjacent to an outer circumferential periphery of the substrate 10. In other words, the first slots 102 are surrounded by the second slots 104. A plurality of rectangular islands 106 are formed between the first slots 102 and the second slots 104. The islands 106 include a plurality of central islands 106 and peripheral islands 106. Each central island 106 is surrounded by four adjacent first slots 102, and each peripheral island 106 is surrounded by one first slot/two first slots 102 and two neighboring second slots 104. Two adjacent islands 106 are connected to each other via a bridge 108 between two adjacent first slots 102 or between one first slot 102 and an adjacent second slot 104.

The epitaxy structure 20 may be firstly formed on a temporary substrate (not shown) in a manner that the second semiconductor layer 50, the light emitting layer 40 and the first semiconductor layer 30 sequentially grown on the temporary substrate. The first semiconductor layer 30 of the epitaxy structure 20 is then electroplated with metal to form the substrate 10. Finally, the temporary substrate is removed from the epitaxy structure 20 so that only the epitaxy structure 20 and the substrate 10 are remained as shown in FIG. 1.

Figure 3:
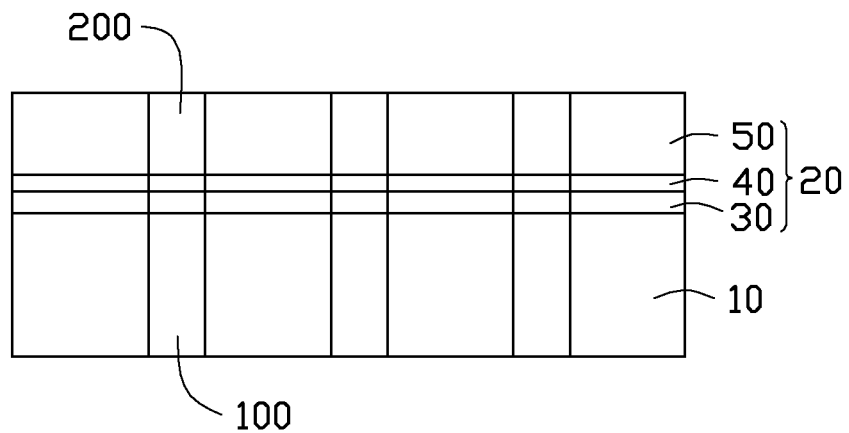
FIG. 3 shows a next step of the method following the step of FIG. 1.
Figure 4:
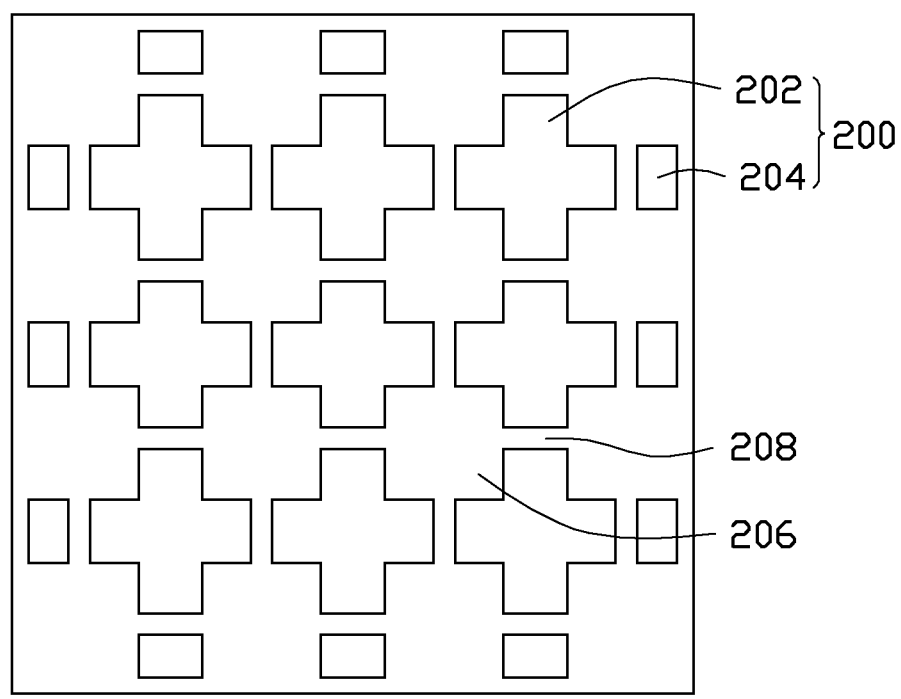
FIG. 4 shows the next step of FIG. 3 from a top view.

Also referring to FIGS. 3-4, the epitaxy structure 20 is defined to form a plurality of grooves 200 by plasma etching. In this embodiment, the grooves 200 include a plurality of first grooves 202 and second grooves 204 spaced from the first grooves 202. The first grooves 202 and the second grooves 204 extend from a top face to a bottom face of the epitaxy structure 20. Lateral faces of the first semiconductor layer 30, the light emitting layer 40 and the second semiconductor layer 50 are exposed in the first grooves 202 and the second grooves 204. Each first groove 202 is aligned and communicates with a corresponding first slot 102 just below each first groove 202, and each second groove 204 is aligned and communicates with a corresponding second slot 104 just below each second groove 204. Alternatively, the first grooves 202 and the second grooves 204 can also be extended from the top face of the epitaxy structure 20 and terminated at a bottom face of the light emitting layer 40, whereby only the lateral faces of the light emitting layer 40 and the second semiconductor layer 50 are exposed within the grooves 200. Each first groove 202 has the same shape as each first slot 102, and each second groove 204 has the same shape as each second slot 204. A plurality of islands 206 are also formed between the first grooves 202 and the second grooves 204. Each island 206 is aligned and connects with a corresponding island 106 of the substrate 10 just below each island 206. Each island 206 of the epitaxy structure 20 also has the same shape as the aligned island 106 of the substrate 10. Two adjacent islands 206 of the epitaxy structure 20 are also connected to each other via a bridge 208 between two adjacent first grooves 202 or between one first groove 202 and an adjacent second groove 204.

Figure 5:
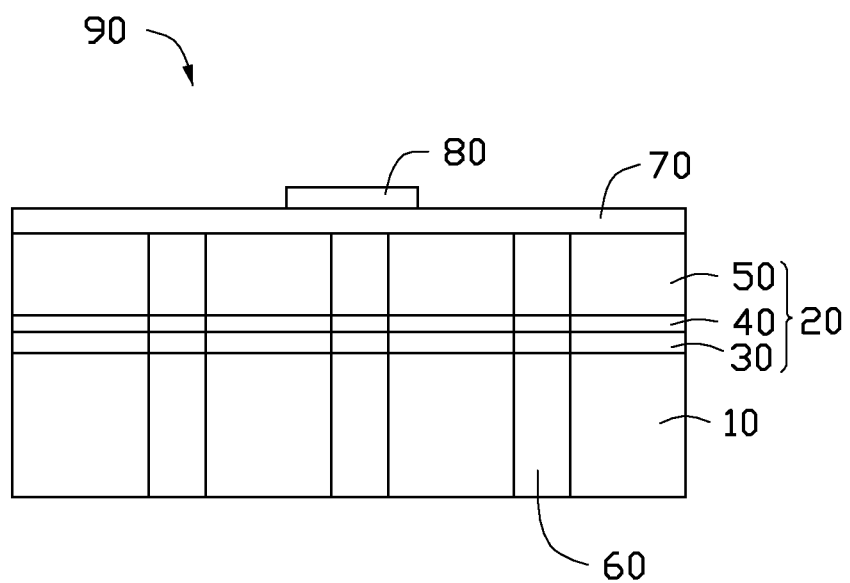
FIG. 5 shows the LED chip which has been manufactured after the steps of FIGS. 1-4.
Figure 6:
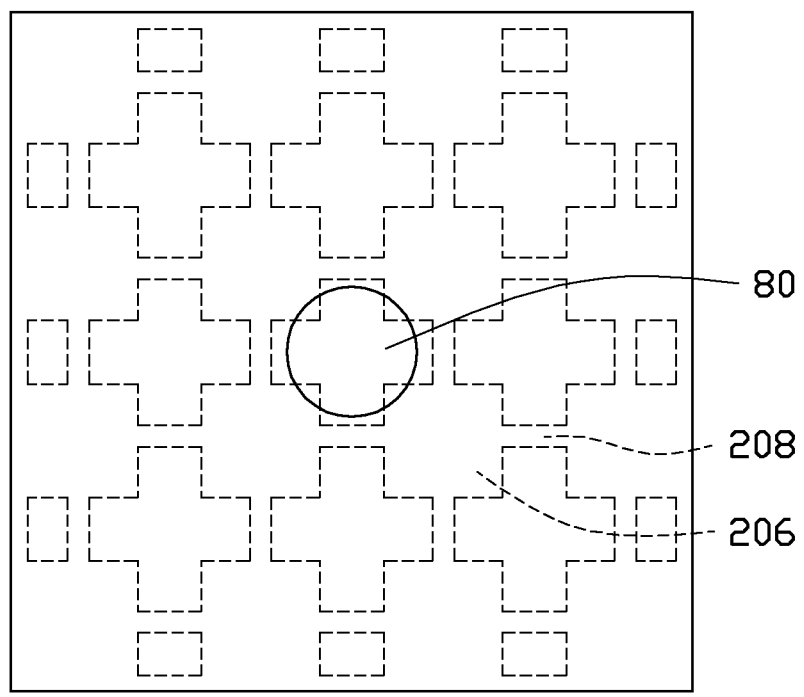
FIG. 6 shows a top of the LED chip of FIG. 5.

Also referring to FIGS. 5-6, the slots 100 and the grooves 200 are filled with a transparent insulative material 60 such as SiO$_2$. The transparent insulative material 60 fully fills the first slots 102, the second slots 104, the first grooves 202 and the second grooves 204. The transparent insulative material 60 has a top face flush with that of the epitaxy structure 20. The transparent insulative material 60 can protect lateral faces of the epitaxy structure 20 from an outside environment. Furthermore, the transparent insulative material 60 can allow light emitted from the lateral faces of the epitaxy structure 20 to pass therethrough to the outside environment. A transparent conductive layer 70 is then formed on the top faces of the epitaxy structure 20 and the transparent insulative material 60 by sputtering deposition. The transparent conductive layer 70 may be made of indium tin oxide, indium zinc oxide or other suitable materials. The transparent conductive layer 70 directly connects the second semiconductor layer 50 and the transparent insulative layer 60. A metal electrode 80 is further formed on a top face of the transparent conductive layer 70. The electrode 80 has an area smaller than that of the transparent conductive layer 70. The transparent conductive layer 70 electrically connects the islands 206 and the bridges 208 with the electrode 80. Thus, when the electrode 80 and the substrate 10 is electrically to an external power source, current input to the LED chip 90 will be uniformly distributed by the transparent conductive layer 70 to flow through the islands 206 and the bridges 208 of the epitaxy structure 20, thereby emitting uniform light.

Since the grooves 200 are defined in the epitaxy structure 20, the LED chip 90 can have an area smaller than a conventional intact chip. Thus, less heat is generated by the LED chip 90 in operation. On the other hand, compared with the conventional intact chip, additional light is emitted to the outside environment from the lateral faces of the epitaxy structure 20 through the transparent insulative material 60 in the grooves 200 and the transparent conductive layer 70. Therefore, the additional light can at least partially counteract loss of light induced by reduction of the area of the LED chip 90. That is to say, the LED chip 90 can have less heat as well as larger light intensity.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED (light emitting diode) chip comprising:
a substrate; and
an epitaxy structure comprising:
a first semiconductor layer formed on the substrate;
a light emitting layer formed on the first semiconductor layer; and
a second semiconductor layer formed on the light emitting layer;
wherein a plurality of grooves are defined in the epitaxy structure such that the light emitting layer is exposed from the plurality of grooves; and
wherein a transparent insulative material is filled in the plurality of grooves;
wherein the plurality of grooves comprise a plurality of first grooves and a plurality of second grooves different from the plurality of first grooves, wherein the plurality of second grooves are spaced differently from the plurality of first grooves.

2. The LED chip of claim 1, wherein the plurality of grooves extend from a top face of the second semiconductor layer and terminate at a bottom face of the light emitting layer.

3. The LED chip of claim 1, wherein the plurality of grooves extend from a top face of the second semiconductor layer and terminate at a bottom face of the first semiconductor layer.

4. The LED chip of claim 1, wherein each of the plurality of first grooves has a cross shape in cross section, and each of the plurality of second grooves has a rectangular shape in cross section.

5. The LED chip of claim 1, wherein the epitaxy structure forms a plurality of islands surrounded by the plurality of grooves, adjacent islands being connected to each other via a bridge between the plurality of grooves.

6. The LED chip of claim 1 further comprising a transparent conductive layer formed on the second semiconductor layer, wherein the transparent conductive layer directly connects the transparent insulative material.

7. The LED chip of claim 1, wherein the substrate defines a plurality of slots communicating the plurality of grooves, the transparent insulative material also filling the slots.

8. An LED (light emitting diode) chip comprising:
a substrate; and
an epitaxy structure comprising:
a first semiconductor layer formed on the substrate;
a light emitting layer formed on the first semiconductor layer; and
a second semiconductor layer formed on the light emitting layer;
wherein a plurality of grooves are defined in the epitaxy structure such that the light emitting layer is exposed from the plurality of grooves; and
wherein a transparent insulative material is filled in the plurality of grooves;
wherein the substrate defines a plurality of slots communicating the plurality of grooves, the transparent insulative material also filling the slots.

9. The LED chip of claim 8, wherein the plurality of grooves extend from a top face of the second semiconductor layer and terminate at a bottom face of the light emitting layer.

10. The LED chip of claim 8, wherein the plurality of grooves extend from a top face of the second semiconductor layer and terminate at a bottom face of the first semiconductor layer.

* * * * *